(12) United States Patent
Zhang

(10) Patent No.: US 11,686,760 B2
(45) Date of Patent: Jun. 27, 2023

(54) METHOD FOR DETERMINING AN ELECTRICAL FAULT OF A CONDUCTIVITY SENSOR, AND CONDUCTIVITY SENSOR

(71) Applicant: Vitesco Technologies GmbH, Hannover (DE)

(72) Inventor: Hong Zhang, Munich (DE)

(73) Assignee: VITESCO TECHNOLOGIES GMBH, Hannover (DE)

( * ) Notice: Subject to any disclaimer, the term of this patent is extended or adjusted under 35 U.S.C. 154(b) by 182 days.

(21) Appl. No.: 17/295,787

(22) PCT Filed: Oct. 23, 2019

(86) PCT No.: PCT/EP2019/078825
§ 371 (c)(1),
(2) Date: May 20, 2021

(87) PCT Pub. No.: WO2020/104133
PCT Pub. Date: May 28, 2020

(65) Prior Publication Data
US 2022/0011362 A1    Jan. 13, 2022

(30) Foreign Application Priority Data

Nov. 21, 2018 (DE) ...................... 10 2018 219 952.3

(51) Int. Cl.
*G01R 31/28* (2006.01)
*G01N 27/10* (2006.01)
*G01R 31/52* (2020.01)

(52) U.S. Cl.
CPC ......... *G01R 31/2829* (2013.01); *G01N 27/10* (2013.01); *G01R 31/52* (2020.01)

(58) Field of Classification Search
CPC .... G01R 31/2829; G01R 31/52; G01R 27/22; G01R 31/54
See application file for complete search history.

(56) References Cited

U.S. PATENT DOCUMENTS

| | | | |
|---|---|---|---|
| 4,583,268 A | 4/1986 | Horcher Born | ............... 24/20 R |
| 5,970,428 A * | 10/1999 | Brennan | ............ G01R 31/2829 |
| | | | 702/65 |

(Continued)

FOREIGN PATENT DOCUMENTS

| | | | |
|---|---|---|---|
| DE | 10014434 A1 | 9/2001 | ............. G01R 31/00 |
| DE | 102010042637 A1 | 4/2012 | ............. G01N 27/04 |

(Continued)

OTHER PUBLICATIONS

Yi, Jikun et al., "The Simulation of Frequency-Capacitance Characteristics of Fresh Water Conductivity Sensor," 4th IEEE International Conference on Nano/Micro Engineered and Molecular Systems, pp. 29-32, Jan. 5, 2009.

(Continued)

*Primary Examiner* — Jermele M Hollington
*Assistant Examiner* — Temilade S Rhodes-Vivour
(74) *Attorney, Agent, or Firm* — Slayden Grubert Beard PLLC

(57) ABSTRACT

Various embodiments include methods for determining an electrical fault of a conductivity sensor for ascertaining the electrical conductivity of a medium using a conductivity principle, wherein the conductivity sensor comprises a first electrode pair fully disposed in the medium comprising: applying an electrical alternating voltage to the first electrode pair; measuring a temporal profile of the electrical alternating current at the first electrode pair resulting from application of the electrical alternating voltage at the first electrode pair; ascertaining a current-amplitude characteristic value from the temporal profile of the electrical alternating current; and identifying an electrical fault of the conductivity sensor if the current-amplitude characteristic value is below a first current threshold value or above a second current threshold value.

8 Claims, 3 Drawing Sheets

(56) References Cited

U.S. PATENT DOCUMENTS

| | | | |
|---|---|---|---|
| 6,417,679 B1 | 7/2002 | Lenz | 324/722 |
| 8,988,083 B2 | 3/2015 | Volker et al. | 324/649 |
| 9,329,226 B2 | 5/2016 | Paul | G01R 31/2829 |
| 10,408,646 B2 | 9/2019 | Spahlinger et al. | |
| 10,509,003 B2 | 12/2019 | Vogt | G01N 27/07 |
| 2006/0254355 A1* | 11/2006 | Zhou | G01R 31/50 |
| | | | 73/579 |
| 2009/0090622 A1* | 4/2009 | Ripley | G01N 15/0656 |
| | | | 204/412 |
| 2011/0050620 A1* | 3/2011 | Hristov | G06F 3/04184 |
| | | | 345/174 |
| 2014/0151224 A1 | 6/2014 | Glezer et al. | 204/407 |
| 2015/0355122 A1 | 12/2015 | Watts | 324/698 |
| 2017/0052243 A1 | 2/2017 | Paul | G01R 35/005 |
| 2017/0131339 A1 | 5/2017 | Inamoto et al. | 324/541 |
| 2017/0185733 A1* | 6/2017 | Nogueira | A61B 5/14735 |
| 2018/0067090 A1* | 3/2018 | Hopka | G01N 33/0036 |
| 2018/0095054 A1 | 4/2018 | Huo et al. | |

FOREIGN PATENT DOCUMENTS

| | | | | |
|---|---|---|---|---|
| DE | 102012106384 A1 | 1/2014 | | G01R 31/26 |
| DE | 102014119453 A1 | 6/2016 | | G01F 1/58 |
| EP | 0108072 | 2/1986 | | F16L 33/02 |
| EP | 1089072 A2 | 4/2001 | | G01N 27/07 |
| EP | 3312600 A1 | 4/2018 | | G01N 27/02 |

OTHER PUBLICATIONS

German Office Action, Application No. 102018219952.3, 8 pages, dated Oct. 11, 2019.

International Search Report and Written Opinion, Application No. PCT/EP2019/078825, 12 pages, dated Jan. 17, 2020.

* cited by examiner

METHOD FOR DETERMINING AN ELECTRICAL FAULT OF A CONDUCTIVITY SENSOR, AND CONDUCTIVITY SENSOR

CROSS-REFERENCE TO RELATED APPLICATIONS

This application is a U.S. National Stage Application of International Application No. PCT/EP2019/078825 filed Oct. 23, 2019, which designates the United States of America, and claims priority to DE Application No. 10 2018 219 952.3 filed Nov. 21, 2018, the contents of which are hereby incorporated by reference in their entirety.

TECHNICAL FIELD

The present disclosure relates to sensors. Various embodiments may include methods for determining an electrical fault of a conductivity sensor and/or conductivity sensors

BACKGROUND

Conductive conductivity sensors are used in a wide range of applications for the measurement of the conductivity of a medium. The best known conductive conductivity sensors are two-electrode or four-electrode sensors.

Two-electrode sensors have two electrodes that are immersed in the medium during measurement operation and to which a DC or AC voltage is applied. Measurement electronics connected to the two electrodes measure an electrical impedance of the conductivity measurement cell, from which a specific resistance or a specific conductance of the medium located in the measurement cell is then ascertained on the basis of a cell constant determined in advance by the geometry and nature of the measurement cell.

Four-electrode sensors have four electrodes immersed in the medium during measurement operation, two of which are operated as what are known as current electrodes and two of which are operated as what are known as voltage electrodes. During measurement operation, a DC or AC voltage is applied between the two current electrodes, and a DC or AC current is thus injected into the medium. The current that is injected causes a potential difference between the voltage electrodes, which is determined through a preferably current-free measurement. In this case too, the impedance of the conductivity measurement cell, resulting from the current that is injected and the measured potential difference, is determined by way of measurement electronics connected to the current and voltage electrodes, from which a specific resistance or a specific conductance of the medium located in the measurement cell is then determined on the basis of a cell constant determined in advance by the geometry and the nature of the measurement cell.

EP 1 089 072 A2 describes a conductivity sensor that has a circular-cylindrical housing, wherein metal measurement electrodes are disposed in a planar manner on a circular-surface-shaped end wall of the circular-cylindrical housing. The metal measurement electrodes in this case form two voltage electrodes and two current electrodes. The voltage electrodes are designed as circular surfaces and are surrounded by the two current electrodes of circular or annular form, disposed essentially in a semicircle.

U.S. Pat. No. 4,227,151 A describes a measurement cell for measuring and monitoring the electrical conductivity of a liquid. This measurement cell comprises a plurality of circular electrodes that are disposed alternately at a distance from and electrically insulated from one another. At least four concentric, circular electrodes are here disposed in or on a plane surface and separated from one another by regions of electrically non-conductive material. The inmost of the four electrodes here is of hollow design in order to accommodate a temperature-sensitive element.

EP 0 386 660 A1 describes a further conductivity measuring transducer. Four concentric metal rings are attached as electrodes for the conductivity measuring transducer at the end face of a cylindrical supporting body of insulating material. The electrodes are here flush with the end face. The electrodes with a greater cross section are connected here as current electrodes, while the electrodes with a lower cross section are used as voltage electrodes.

DE 10 2010 042 637 A1 describes a conductivity sensor in which the concentrically disposed electrodes have an equal, constant area. In the conductivity sensors known from the prior art, checking the proper functionality of the electrics of the electrodes through the provision of additional electrical circuitry is known. Additional circuitry for the voltage electrodes can be provided in, for example, four-electrode sensors. The voltage electrodes are each connected here via voltage elements to a voltage source. A voltage that is smaller than a predetermined voltage threshold value results when the electrical connection of the voltage electrodes has the proper functionality. However, in the presence of a break in the electrical connection of the voltage electrodes, the voltage rises up to a maximum of the voltage value of the voltage source and exceeds the predetermined voltage threshold value.

SUMMARY

The teachings of the present disclosure include methods for determining an electrical fault in a conductivity sensor, in particular of at least one electrode pair of the conductivity sensor, that can be carried out as continuously as possible during the operation of the conductivity sensor, and without additional electrical elements for the purpose. For example, some embodiments include a method for determining an electrical fault of a conductivity sensor (100) for ascertaining the electrical conductivity of a medium in accordance with the conductivity principle, wherein the conductivity sensor (100) comprises a first electrode pair (110) that is designed to be fully disposed in the medium, wherein the method comprises: applying an electrical alternating voltage to the first electrode pair (110), ascertaining the temporal profile of the electrical alternating current at the first electrode pair (110) resulting in response to the application of the electrical alternating voltage at the first electrode pair (110), ascertaining a current-amplitude characteristic value of the ascertained temporal profile of the electrical alternating current, and determining an electrical fault of the conductivity sensor (100) if the ascertained current-amplitude characteristic value is below a first current threshold value or above a second current threshold value.

In some embodiments, the determination of an electrical fault of the conductivity sensor (110) comprises: determining a short circuit between the electrodes (112, 114) of the first electrode pair (110) if the ascertained current-amplitude characteristic value lies above the first current threshold value, and/or determining a break in one of the electrical supply lines to the electrodes (112, 114) of the first electrode pair (110) if the ascertained current-amplitude characteristic value lies below the first current threshold value.

In some embodiments, the first current threshold value and/or the second current threshold value is predetermined depending on the applied voltage amplitude value and the geometry of the electrodes (112, 114) of the first electrode pair (110).

In some embodiments, the current-amplitude characteristic value corresponds to the amplitude, the root-mean-square value or the peak-to-peak current value of the temporal profile of the electrical alternating current.

In some embodiments, the conductivity sensor (100) further comprises a second electrode pair (120) that is designed to be fully disposed in the medium, wherein, if it is determined that there is no electrical fault of the first electrode pair (110), the method further comprises: ascertaining the temporal profile of the electrical alternating voltage at the second electrode pair (120) resulting from the alternating voltage applied at the first electrode pair (110), ascertaining a voltage-amplitude characteristic value of the ascertained temporal profile of the electrical alternating voltage at the second electrode pair (120), and determining an electrical fault of the second electrode pair (120) if the ascertained voltage-amplitude characteristic value lies below a voltage threshold value.

In some embodiments, the voltage threshold value is predetermined depending on the voltage amplitude value applied at the first electrode pair (110) and the geometry of the electrodes (122, 124) of the first and second electrode pair (120).

In some embodiments, the voltage-amplitude characteristic value corresponds to the amplitude, the root-mean-square value or the peak-to-peak voltage value of the temporal profile of the electrical alternating voltage.

In some embodiments, the determination of an electrical fault of the second electrode pair (120) comprises: ascertaining a phase shift between the alternating voltage applied at the first electrode pair (110) and the alternating voltage resulting from it at the second electrode pair (120), determining a short circuit between the electrodes (122, 124) of the second electrode pair (120) if the ascertained phase shift lies below a predetermined phase threshold value, and determining a break in one of the electrical supply lines to the electrodes (122, 124) of the second electrode pair (120) if the ascertained phase shift lies above the predetermined phase threshold value.

As another example, some embodiments include a conductivity sensor (100) for capturing the electrical conductivity of a medium in accordance with the conductivity principle, wherein the conductivity sensor (100) comprises: a first electrode pair (110) that is designed to be fully disposed in the medium, a second electrode pair (120) that is designed to be fully disposed in the medium, and a control unit that is electrically connected to the first electrode pair (110) and the second electrode pair (120) and that is designed to carry out a method to determine an electrical fault of the conductivity sensor (100) as claimed in one of the preceding claims.

BRIEF DESCRIPTION OF THE DRAWINGS

Further advantages and configurations of the teachings of the present disclosure are described herein with regard to the appended drawings, in which.

DETAILED DESCRIPTION

Figure 1:
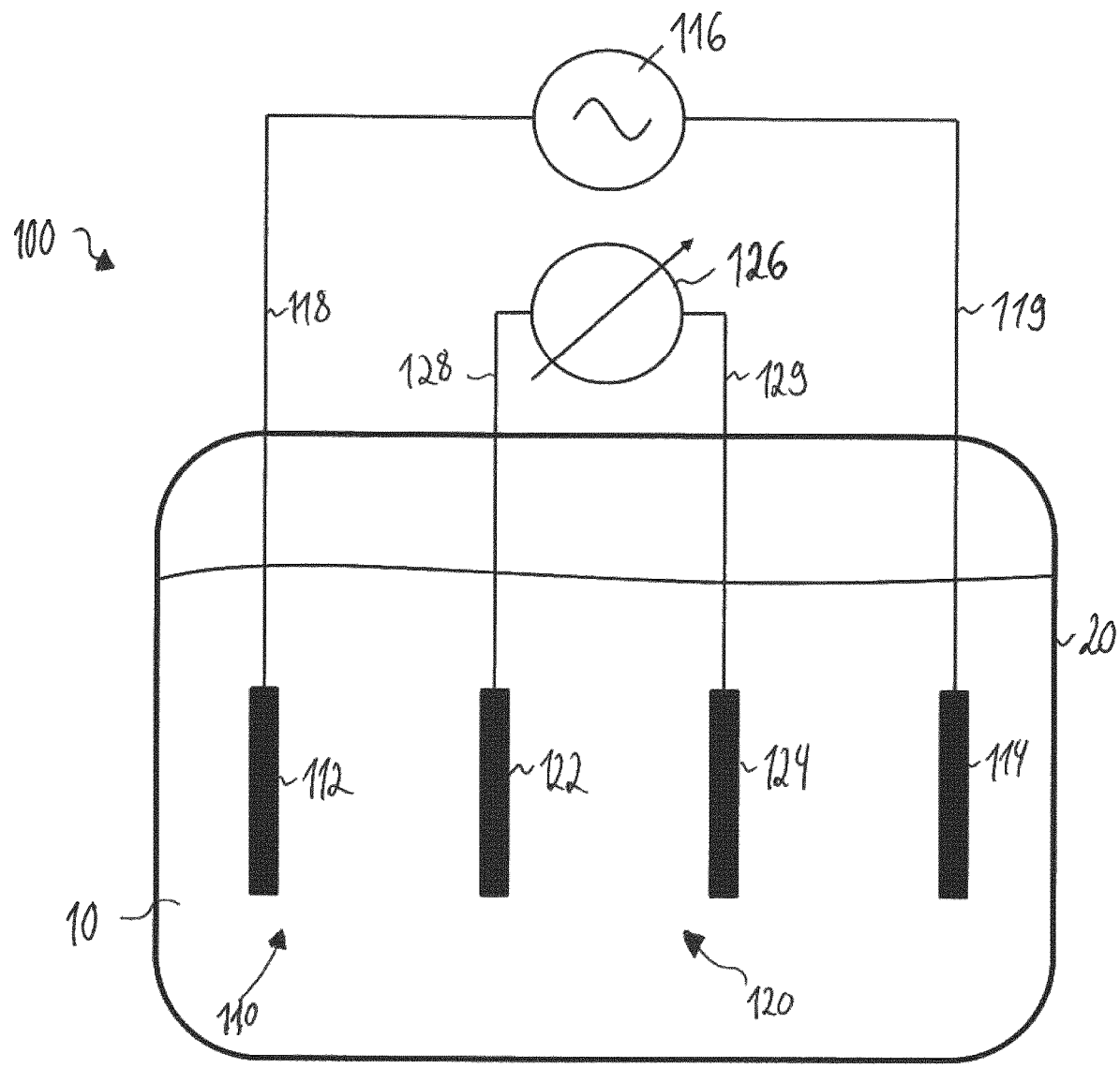
FIG. 1 shows a schematic view of a conductivity sensor incorporating teachings of the present disclosure with a first electrode pair and a second electrode pair.

Various embodiments of the teachings of the present disclosure may be used to carry out a check with respect to the proper functional capability of the conductivity sensor without additional electrical elements in a conductivity sensor for ascertaining the electrical conductivity of a medium such as, for example, water for a water injection in a combustion engine for a vehicle. The conductivity sensor, which in some embodiments can be a four-electrode sensor, is operated for this purpose in its operating mode for ascertaining the electrical conductivity of the medium, wherein during this operating mode the diagnosis in respect of the proper conductivity can be carried out in that a check can be made as to whether the at least one pair of electrodes is operating properly. Whether the at least one electrode pair is short-circuited and/or there is a line break in the electrical supply lines to the at least one electrode pair is in particular checked. This is for example ascertained through evaluating the alternating current resulting from the application of an alternating voltage.

In some embodiments, a method for determining an electrical fault in a conductivity sensor for ascertaining the electrical conductivity of a medium employs the conductivity principle. In some embodiments, the conductivity sensor has a first electrode pair that is designed to be fully disposed in the medium. In some embodiments, the method comprises an application of an electrical alternating voltage at the first electrode pair, an ascertainment of the temporal profile of the electrical alternating current at the first electrode pair resulting in response to the application of the electrical alternating voltage at the first electrode pair, an ascertainment of a current-amplitude characteristic value of the ascertained temporal profile of the electrical alternating current, and a determination of an electrical fault of the conductivity sensor if the ascertained current-amplitude characteristic value is below a first predetermined current threshold value or above a second predetermined current threshold value.

In some embodiments, the application of the alternating voltage to the first electrode pair takes place during the operation of the conductivity sensor while the electrical conductivity of the medium, e.g. water for water injection in a combustion engine of a vehicle, is captured by means of the conductivity sensor. In some embodiments, the alternating voltage applied to the first electrode pair for operation of the conductivity sensor is used simultaneously for diagnosis of the functional capability of the conductivity sensor, in particular of the first electrode pair.

In some embodiments, the determination of an electrical fault of the first electrode pair comprises a determination of a short circuit between the electrodes of the first electrode pair if the ascertained current-amplitude characteristic value lies above the first predetermined current threshold value. In some embodiments, the determination of an electrical fault of the first electrode pair comprises, according to some embodiments of the method, a determination of a break in one of the electrical supply lines to the electrodes of the first electrode pair if the ascertained current-amplitude characteristic value lies below the second predetermined current threshold value.

In some embodiments, in the case of a short circuit between the electrodes of the first electrode pair, the alternating current resulting from the alternating voltage applied to the first electrode pair is greater than the first predetermined current threshold value, and that a proper measurement of the electrical conductivity of the medium can thus no longer be ensured. In contrast to this, a break in one of the electrical supply lines to the electrodes of the first electrode pair has the result that the alternating current lies below the second predetermined current threshold value, and thus again a proper measurement of the electrical conductivity of the medium cannot be carried out. In some embodiments, the first predetermined current threshold value when a voltage amplitude of approximately 0.5 V is applied to the first electrode pair, depending on the diameter of the rod electrodes and on the distance of the rod electrodes from one another, is approximately 0.1 mA, and the second predetermined current threshold value is approximately 100 mA. These values for the two current threshold values apply, for example, to rod electrodes with a diameter of about 6 mm, a length of about 4 mm, and a distance of about 8 mm between them.

In some embodiments, the current-amplitude characteristic value corresponds to the amplitude, the root-mean-square value or the peak-to-peak current value of the temporal profile of the electrical alternating current. The peak-to-peak current value here describes the difference between the maximum and minimum values of the sinusoidal temporal profile of the alternating current, or the peak-valley value.

In some embodiments, the conductivity sensor further comprises a second electrode pair that is designed to be fully disposed in the medium. If it is established that there is no electrical fault of the first electrode pair, which means that the first electrode pair is functioning properly and can be electrically driven, the method further includes an ascertainment of the temporal profile of the electrical alternating voltage at the second electrode pair as a result of the alternating voltage applied at the first electrode pair, an ascertainment of a voltage-amplitude characteristic value of the ascertained temporal profile of the electrical alternating voltage at the second electrode pair, and a determination of an electrical fault of the second electrode pair if the ascertained voltage-amplitude characteristic value lies below a predetermined voltage threshold value.

In some embodiments, the method includes determining whether the second electrode pair is also functioning properly and thus the complete conductivity sensor, preferably designed as a four-electrode sensor, can be operated properly. The checking of the functional capability of the second electrode pair of course does not occur until the first electrode pair has been diagnosed as functionally capable. In some embodiments, the application of the alternating voltage to the first electrode pair, and the proper alternating current resulting from that at the first electrode pair, that the potential difference at the second electrode pair can then result, and consequently it can also only then be ascertained whether an electrical fault is at all present at the second electrode pair.

In some embodiments, the predetermined voltage threshold value with a voltage amplitude of about 0.5 V applied at the first electrode pair can be about 0.1 V, depending on the diameter of the rod electrodes and on the distance of the rod electrodes from one another. This value for the voltage threshold values applies, for example, to rod electrodes with a diameter of about 6 mm, a length of about 4 mm and a distance of about 8 mm between them. In some embodiments, the voltage-amplitude characteristic value corresponds to the amplitude, the root-mean-square value or the peak-to-peak voltage value of the temporal profile of the electrical alternating voltage. The peak-to-peak voltage value here describes the difference between the maximum and minimum values of the sinusoidal temporal profile of the alternating voltage resulting at the second electrode pair, i.e. the peak-valley value.

In some embodiments, the determination of an electrical fault of the second electrode pair comprises an ascertainment of a phase shift between the alternating voltage applied at the first electrode pair and the alternating voltage resulting from it at the second electrode pair, a determination of a short circuit between the electrodes of the second electrode pair if the ascertained phase shift lies below a predetermined phase threshold value, and a determination of a break in one of the electrical supply lines to the electrodes of the second electrode pair if the ascertained phase shift lies above the predetermined phase threshold value. In some embodiments, there is scarcely any phase shift between the temporal voltage profile at the first electrode pair and the temporal voltage profile at the second electrode pair in the presence of a short circuit. In contrast, in the presence of a line break this phase shift would increase.

In some embodiments, there is a conductivity sensor for capturing the electrical conductivity of a medium according to the conductivity principle. In some embodiments, the conductivity sensor comprises a first electrode pair that is designed to be fully disposed in the medium, a second electrode pair that is designed to be fully disposed in the medium and a control unit that is electrically connected to the first electrode pair and the second electrode pair and is designed to carry out a method for determining the electrical fault of the conductivity sensor in accordance with methods described herein.

In the context of the present disclosure, the term "electrical fault" refers to a fault state of the conductivity sensor in terms of its electrical components, in particular of its electrodes or electrical supply lines to the electrodes. An electrical fault can, for example, be present in the form of a short circuit between the electrodes or in the form of a break in the supply lines to the electrodes.

FIG. 1 shows a schematic view of a conductivity sensor 100 incorporating teachings of the present disclosure. The conductivity sensor 100 may be used to ascertain the electrical conductivity of a medium 10 that is disposed in a container 20. The medium is, for example, water that can be injected for injection into the combustion chambers of a combustion engine of a vehicle. The medium can, alternatively, also be an aqueous solution of urea that is disposed in a urea container and is designed to be injected into an exhaust gas tract upstream of an SCR catalytic converter. In addition, the medium can be an alcohol such as, for example, ethanol, that is maintained in an alcohol container and is designed to be injected into the combustion chambers of the combustion engine of the vehicle.

The conductivity sensor 100 shown comprises a first electrode pair 110, a second electrode pair 120 and a control unit (not explicitly illustrated in FIG. 1), that is electrically connected to the first electrode pair 110 and the second electrode pair 120 and is designed to operate the first electrode pair 110 and the second electrode pair 120 and to evaluate the corresponding electrical signals. The control unit may carry out the methods described herein for determining an electrical fault of a conductivity sensor 100, in particular of the first electrode pair 110 and of the second electrode pair 120, which will be explained in more detail below with reference to FIGS. 3 and 4.

The conductivity sensor 100 of FIG. 1 comprises a four-electrode sensor. The first electrode pair 110 comprises a first electrode 112 and a second electrode 114 that are disposed at a predetermined distance from one another in the medium 10. The first electrode 112 and the second electrode 114 are each electrically connected to a voltage source 116, in particular an alternating voltage source, by way of supply lines 118, 119.

The second electrode pair 120 comprises a third electrode 122 and a fourth electrode 124 that are disposed at a predetermined distance from one another in the medium 10. The third electrode 122 and the fourth electrode 124 are each electrically connected to a measuring instrument 128, in particular a voltage measuring instrument, by way of electrical supply lines 128, 129.

As shown in FIG. 1, the electrodes 122, 124 of the second electrode pair 120 are disposed between the electrodes 112, 114 of the first electrode pair 110. All of the electrodes 112, 114, 122, 124 are, moreover, designed as rod electrodes, and are suitable for being completely immersed in the medium 10. In some embodiments, the electrodes comprise cylindrical electrodes disposed concentrically with respect to one another. In some embodiments, the shape and arrangement of the electrodes with respect to one another is not restricted to the configuration shown in FIG. 1, but the shape and arrangement of the electrodes can be selected as appropriate.

The measurement principle of the conductivity sensor 100 of FIG. 1 is based on the conductivity principle. In particular, an alternating voltage is applied by means of the alternating voltage source 160 to the electrodes 112, 114 of the first electrode pair 110, and the alternating current at the electrodes 112, 114 of the first electrode pair resulting from it is then ascertained. To eliminate boundary and surface effects, the second electrode pair 120 is also used to take these disturbing effects into account in order to increase the accuracy of the measurement.

A potential difference in the form of an alternating voltage between the electrodes 122, 124 of the second electrode pair 120 is ascertained by means of the measuring instrument 126 for this purpose. The potential difference between the electrodes 122, 124 of the second electrode pair 120 develops on the basis of the alternating voltage applied to the electrodes 112, 114 of the first electrode pair 120. The electrical resistance of the medium 10 can then be ascertained from the ascertained potential difference between the electrodes 122, 124 of the second electrode pair and the alternating current at the electrodes 112, 114 of the first electrode pair that results from the alternating voltage applied to them. Taking the geometrical dimensions of the electrodes into consideration, the electrical conductivity can then be ascertained and determined as the reciprocal of the electrical resistance of the medium.

Figure 2:
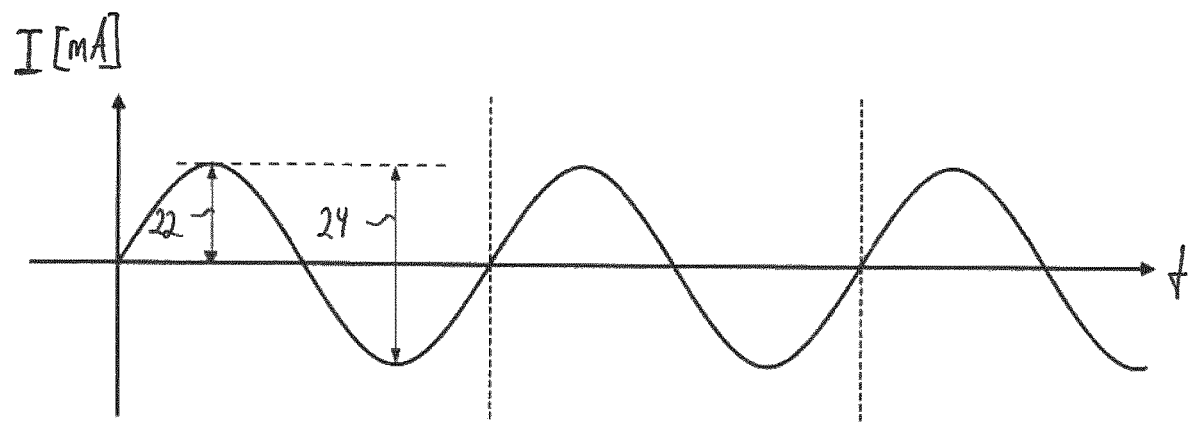
FIG. 2 shows a diagram of a temporal profile of the alternating current resulting at the first electrode pair from an alternating voltage applied to the first electrode pair incorporating teachings of the present disclosure.

FIG. 2 shows an exemplary temporal profile of the alternating current resulting at the first electrode pair 110 from the alternating voltage applied to the first electrode pair 110. The temporal profile of the alternating current in FIG. 2 is essentially sinusoidal. The arrow 22 in FIG. 2 shows the amplitude of the alternating current, and the arrow 24 describes the peak-to-peak current value of the alternating current of one oscillation. The amplitude 22 or the peak-to-peak current value 24 can, as is explained in more detail later with reference to FIG. 3, be used for checking the functionality of the electrical conductivity sensor. The root-mean-square value of the sinusoidal alternating current can, alternatively, be used.

Figure 3:
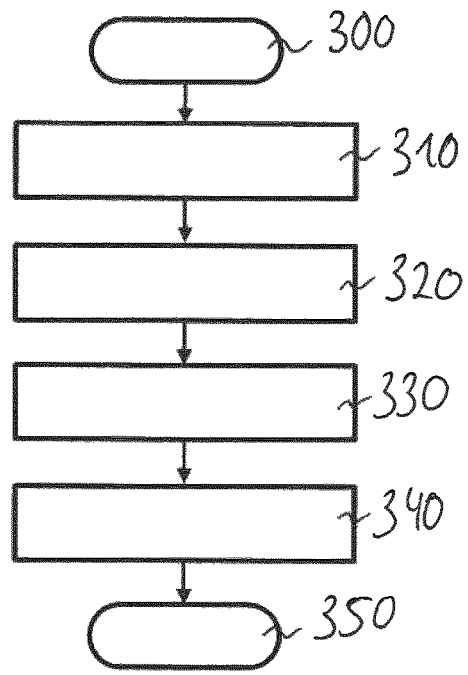
FIG. 3 shows an exemplary flow diagram of a method incorporating teachings of the present disclosure for determining an electrical fault of the conductivity sensor of FIG. 1.

FIG. 3 shows an exemplary flow diagram of a method incorporating teachings of the present disclosure for determining an electrical fault of the conductivity sensor 100. In some embodiments, the method is not carried out until it is determined that the electrodes 112, 114, 122, 124 of the conductivity sensor 100 are completely positioned in the medium 10. This can, for example, be done by capturing the level to which the container 20 is filled with the medium 10. If the filling level is above a predetermined filling level threshold value, it can be concluded that the electrodes 112, 114, 122, 124 of the conductivity sensor 100 are completely immersed in the medium 10. The same applies to the method of FIG. 4, which is described further below.

The method of FIG. 3 starts with step 300 and then proceeds to step 310 in which, as is known for the proper measurement operation of the electrical conductivity sensor 100, an electric alternating voltage is applied to the first electrode pair 110. In a subsequent step 320, as is also known for the proper measurement operation of the electrical conductivity sensor 100, the temporal profile of the electrical alternating current at the first electrode pair 110 resulting in response to the application of the electrical alternating voltage at the first electrode pair 110 is ascertained (see, for example, the temporal profile of the alternating current of FIG. 2).

In some embodiments, a current-amplitude characteristic value of the ascertained temporal profile of the electrical alternating current is ascertained in a subsequent step 330. For example, the amplitude 22 or the peak-to-peak current value 24 (see FIG. 2) of the temporal profile of the electrical alternating current can be employed. In some embodiments, its root-mean-square value can be used.

In a further subsequent step 340, an electrical fault of the first electrode pair 110 is determined if the ascertained current-amplitude characteristic value is below a first predetermined current threshold value or above a second predetermined current threshold value. In some embodiments, a short circuit between the electrodes 112, 114 of the first electrode pair 110 can be determined if the ascertained current-amplitude characteristic value lies above the first predetermined current threshold value. In particular, a current value with an above-average amplitude would be measured in the presence of a short circuit between the electrodes 112, 114 of the first electrode pair 110, which can then be identified as a short circuit and interpreted as an electrical fault of the conductivity sensor 100.

If, however, the ascertained current-amplitude characteristic value lies below the second predetermined current threshold value, it can be concluded that there is a break in one of the electrical supply lines 118, 119 to the electrodes 112, 114 of the first electrode pair 110. Such a break namely has the effect that no current, or only an extremely low current, can flow between the electrodes 112, 114 of the first electrode pair 110, and thus also that the alternating voltage applied there can no longer be applied properly.

Figure 4:
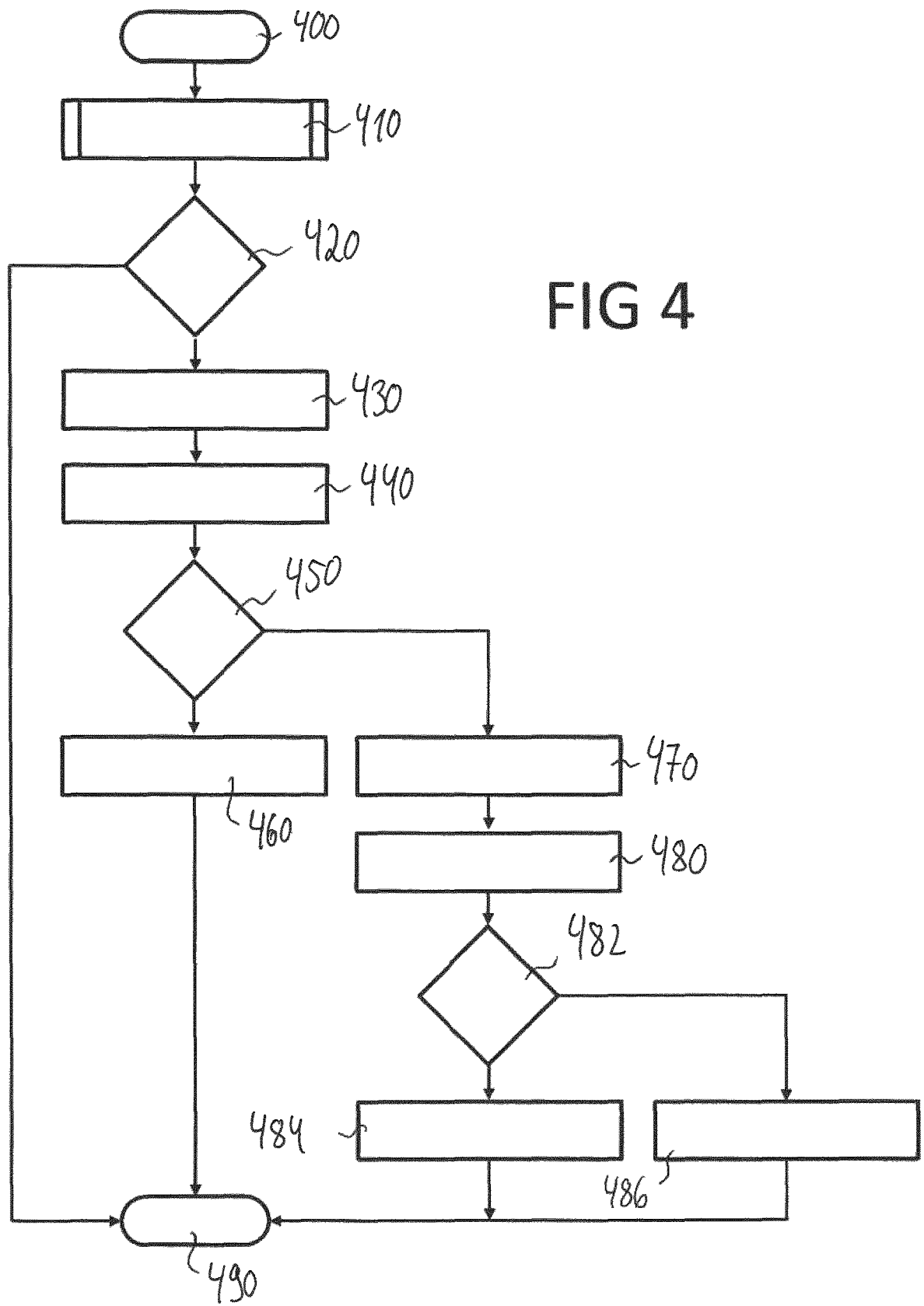
FIG. 4 shows an exemplary flow diagram of an example method incorporating teachings of the present disclosure for determining an electrical fault of the conductivity sensor of FIG. 1.

In some embodiments, after a determination of the proper functional capability of the first electrode pair 110 of the conductivity sensor 100, in addition the functional capability of the second electrode pair 120 of the conductivity sensor is also checked. FIG. 4 shows for this purpose an exemplary flow diagram for a corresponding method.

The method of FIG. 4 begins at step 400, and then proceeds to step 410 in which the method according to FIG. 3 for ascertaining the functional capability of the first electrode pair 110 of the conductivity sensor 100 is carried out. Whether an electrical fault of the first electrode pair 110 of the conductivity sensor 100 has been determined in the method of FIG. 3 is queried in a subsequent step 420. If an electrical fault of the first electrode pair 110 is determined in step 420, the method proceeds to step 490 and is ended. This is because it is only if the first electrode pair 110 of the conductivity sensor 100 is functioning properly that the electrical functional capability of the second electrode pair 120 of the conductivity sensor 100 can be checked.

If, however, it is determined in step 420 that there is no electrical fault in the first electrode pair 110 of the conductivity sensor 100, the method of FIG. 4 proceeds to step 430, in which the temporal profile of the electrical alternating voltage at the second electrode pair 120 of the conductivity sensor 100 resulting from the alternating voltage applied at the first electrode pair 110 is ascertained, as is also done in the normal measurement operation of the conductivity sensor 100.

A voltage-amplitude characteristic value of the ascertained temporal profile of the electrical alternating voltage of the second electrode pair 120 of the conductivity sensor 100 is thereupon ascertained in step 440. In a subsequent step 450, a check is made as to whether the ascertained voltage-amplitude characteristic value is below a predetermined voltage threshold value. If it is established in step 450 that the ascertained voltage-amplitude characteristic value is greater than the predetermined voltage threshold value, the method proceeds to step 460, in which the second electrode pair 120 of the conductivity sensor 100 is determined to be functionally capable, before the method ends at step 490.

If, however, it is established in step 450 that the ascertained voltage-amplitude characteristic value is smaller than the predetermined voltage threshold value, the method proceeds to step 470 in which an electrical fault of the second electrode pair 120 of the conductivity sensor 100 is initially ascertained. In a subsequent step 480, a phase shift between the alternating voltage applied to the first electrode pair 110 of the conductivity sensor 100 and the alternating voltage found as a result at the second electrode pair 120 of the conductivity sensor 100 is ascertained.

If it is determined in a subsequent step 482 that the ascertained phase shift is smaller than a predetermined phase threshold value, the method proceeds to step 484 in which a short circuit between the electrodes 122, 124 of the second electrode pair 120 of the conductivity sensor 100 is established, before the method ends at step 490. The phase threshold value is, for example, approximately 10°.

If, however, it is determined in step 482 that the ascertained phase shift is greater than the predetermined phase threshold value, the method proceeds to step 486 in which a break in one of the electrical supply lines 128, 128 to the electrodes 122, 124 of the second electrode pair 120 of the conductivity sensor 100 is established before the method ends at step 490.

In some embodiments, in the presence of a short circuit between the electrodes 122, 124 of the second electrode pair 120 of the conductivity sensor 100, there is hardly any phase shift between the temporal voltage profile at the first electrode pair 110 and the temporal voltage profile at the second electrode pair 110. In contrast, in the presence of a line break this phase shift would increase.

Using the methods described herein and the conductivity sensor 100, it is possible to perform a diagnosis, such as for example an OBD diagnosis, regarding the functional capability of the conductivity sensor 100 continuously during the operation of the conductivity sensor 100, without here providing separate electrical components and circuitry. Diagnosis can moreover take place during the ongoing operation of the conductivity sensor 100, so that it does not have to be interrupted for diagnostic purposes.

The invention claimed is:

1. A method for determining an electrical fault of a conductivity sensor for ascertaining the electrical conductivity of a medium, wherein the conductivity sensor comprises a first electrode pair and a second electrode pair both fully disposed in the medium, the method comprising:
  applying an electrical alternating voltage to the first electrode pair;
  measuring a temporal profile of the electrical alternating current at the first electrode pair resulting from application of the electrical alternating voltage at the first electrode pair;
  ascertaining a current-amplitude characteristic value from the temporal profile of the electrical alternating current; and
  if the current-amplitude characteristic value is below a first current threshold value or above a second current threshold value, identifying an electrical fault of the conductivity sensor identifying an electrical fault of the conductivity sensor; or
  if the current-amplitude characteristic value lies between the first current threshold value and the second current threshold value, measuring a temporal profile of the electrical alternating voltage at the second electrode pair resulting from application of the alternating voltage at the first electrode pair, determining a voltage-amplitude characteristic value of the temporal profile of the electrical alternating voltage at the second electrode pair, and determining an electrical fault of the second electrode pair if the ascertained voltage-amplitude characteristic value lies below a voltage threshold value.

2. The method as claimed in claim 1, wherein identifying an electrical fault of the conductivity sensor comprises:
  identifying a short circuit between the electrodes of the first electrode pair if the current-amplitude characteristic value lies above the first current threshold value; and/or
  determining a break in an electrical supply line to one of the electrodes of the first electrode pair if the current-amplitude characteristic value lies below the first current threshold value.

3. The method as claimed in claim 1, wherein the first current threshold value and/or the second current threshold value is predetermined depending on the applied voltage amplitude value and the geometry of the electrodes of the first electrode pair.

4. The method as claimed in claim 1, wherein the current-amplitude characteristic value corresponds to the amplitude, the root-mean-square value, or the peak-to-peak current value of the temporal profile of the electrical alternating current.

5. The method as claimed in claim 1, wherein the voltage threshold value depends on the voltage amplitude value applied at the first electrode pair and the geometry of the electrodes of the first and second electrode pair.

6. The method as claimed in claim 1, wherein the voltage-amplitude characteristic value corresponds to the amplitude, the root-mean-square value, or the peak-to-peak voltage value of the temporal profile of the electrical alternating voltage.

7. The method as claimed in claim 1, wherein identifying an electrical fault of the second electrode pair comprises:

ascertaining a phase shift between the alternating voltage applied at the first electrode pair and the alternating voltage resulting from it at the second electrode pair;

determining a short circuit between the electrodes of the second electrode pair if the ascertained phase shift lies below a predetermined phase threshold value, and determining a break in an electrical supply line to one of the electrodes of the second electrode pair if the ascertained phase shift lies above the predetermined phase threshold value.

8. A conductivity sensor for capturing the electrical conductivity of a medium using a conductivity principle, the sensor comprising:

a first electrode pair fully disposed in the medium;

a second electrode pair fully disposed in the medium; and a control unit electrically connected to the first electrode pair and the second electrode pair, the control unit programmed to:

apply an electrical alternating voltage to the first electrode pair;

measure a temporal profile of the electrical alternating current at the first electrode pair resulting from application of the electrical alternating voltage at the first electrode pair;

ascertain a current-amplitude characteristic value from the temporal profile of the electrical alternating current; and identify an electrical fault of the conductivity sensor if the current-amplitude characteristic value is below a first current threshold value or above a second current threshold value.

\* \* \* \* \*